United States Patent
Torres et al.

(10) Patent No.: US 8,143,157 B2
(45) Date of Patent: Mar. 27, 2012

(54) FABRICATION OF A DIFFUSION BARRIER CAP ON COPPER CONTAINING CONDUCTIVE ELEMENTS

(75) Inventors: Joaquin Torres, Saint Martin le Vinoux (FR); Laurent Gosset, Grenoble (FR); Vincent Arnal, Grenoble (FR); Sonarith Chhun, AG Eindhoven (NL)

(73) Assignees: NXP B.V., Eindhoven (NL); ST Microelectronics (Crolles 2) SAS, Crolles (FR)

( * ) Notice: Subject to any disclaimer, the term of this patent is extended or adjusted under 35 U.S.C. 154(b) by 327 days.

(21) Appl. No.: 12/516,127

(22) PCT Filed: Nov. 27, 2007

(86) PCT No.: PCT/EP2007/062905
§ 371 (c)(1),
(2), (4) Date: May 22, 2009

(87) PCT Pub. No.: WO2008/065125
PCT Pub. Date: Jun. 5, 2008

(65) Prior Publication Data
US 2010/0044865 A1 Feb. 25, 2010

(30) Foreign Application Priority Data
Nov. 29, 2006 (EP) .................................. 06291834

(51) Int. Cl.
*H01L 21/4763* (2006.01)
*H01L 23/48* (2006.01)
(52) U.S. Cl. ........ 438/627; 438/643; 438/653; 438/687; 257/751; 257/762
(58) Field of Classification Search .................. 438/622, 438/627, 630, 637, 643, 648, 653, 656, 675, 438/687; 257/750, 751, 758, 762, 763, 768
See application file for complete search history.

(56) References Cited

U.S. PATENT DOCUMENTS
6,339,025 B1 * 1/2002 Liu et al. ....................... 438/687
(Continued)

FOREIGN PATENT DOCUMENTS
DE 4447597 B4 9/2004
(Continued)

OTHER PUBLICATIONS
Kazuhide Abe, Syunichi Tokitoh, Shih-Chang Chen, Jun Kanamori, and Hiroshi Onoda; Effect of Ti Insertion between Cu and TiN Layers on Electromigration reliability in Cu/(Ti)/TiN/Ti Layered Damascene Interconnects; IEEE 00CH37059. 38th Annual International Reliability Physics Symposium; San Jose, CA; 2000; p. 333-338.
(Continued)

*Primary Examiner* — Kevin M Picardat

(57) ABSTRACT

A method for fabricating a self-aligned diffusion-barrier cap on a Cu-containing conductive element in an integrated-circuit device comprises:—providing a substrate having a Cu-containing conductive element embedded laterally into a dielectric layer and having an exposed surface;—depositing a metal layer on the exposed surface of conductive element;—inducing diffusion of metal from the metal layer into a top section of the conductive element;—removing the remaining metal layer;—letting diffused metal in the top section of the conductive element and particles of a second constituent react with each other so as to build a compound covering the conductive element. The metal of the metal layer and the second constituent are chosen so that the compound forms a diffusion barrier against Cu diffusion. A reduction the dielectric constant of the dielectric material in an interconnect stack of an integrated-circuit device is achieved.

11 Claims, 3 Drawing Sheets

U.S. PATENT DOCUMENTS

| | | |
|---|---|---|
| 6,342,444 B1 | 1/2002 | Higashi et al. |
| 6,355,559 B1 | 3/2002 | Havemann et al. |
| 6,528,419 B1 | 3/2003 | Kordic et al. |
| 6,958,296 B2 | 10/2005 | Chen et al. |
| 6,977,218 B2 * | 12/2005 | Yu et al. ............... 438/633 |
| 7,205,228 B2 * | 4/2007 | Padhi et al. ............ 438/652 |
| 7,268,073 B2 * | 9/2007 | Ramappa et al. ....... 438/652 |
| 7,855,143 B2 * | 12/2010 | Liu et al. ............... 438/643 |
| 2004/0056329 A1 | 3/2004 | Maiz et al. |
| 2004/0130030 A1 | 7/2004 | Kunimune et al. |
| 2004/0207093 A1 | 10/2004 | Sun et al. |
| 2006/0052958 A1 | 3/2006 | Hancock et al. |

FOREIGN PATENT DOCUMENTS

| | | |
|---|---|---|
| WO | 2006052958 A | 5/2006 |
| WO | 2007060640 A2 | 5/2007 |

OTHER PUBLICATIONS

International Search Report for International Application No. PCT/EP2007/062905.

* cited by examiner

FABRICATION OF A DIFFUSION BARRIER CAP ON COPPER CONTAINING CONDUCTIVE ELEMENTS

FIELD OF THE INVENTION

The present invention relates to a method for fabricating a diffusion-barrier cap on a copper-containing conductive element, particularly in an integrated-circuit device. It also relates to a method for fabricating an integrated-circuit device.

BACKGROUND OF THE INVENTION

In the design of integrated-circuit devices, decreasing the resistance-capacitance (RC) delay time in interconnect elements between the circuit elements, such as transistors, is an important goal for increasing the speed of signal transmission between circuit elements. In order to reduce the RC delay time, a known strategy is to use a porous ultra-low-k (P-ULk) insulator material to decrease the capacitance, and to use copper-containing material for the interconnect elements for providing a low resistance.

The use of copper (Cu) for conductive interconnect elements of advanced integrated-circuit devices has improved device performance due to the lower resistivity of Cu in comparison with aluminum (Al)-based conductive elements, which were previously used for this purpose. Cu-containing conductive interconnect elements also exhibit an improved electromigration performance. On the other hand, the diffusion of Cu from the conductive interconnect elements into neighboring layers is known to lead to a degradation not only of the interconnect elements, but also of the overall performance of active devices.

A prevention of Cu diffusion from the Cu-containing conductive elements, which is also referred to as passivation of the Cu-containing conductive elements in the present application, is possible by depositing a diffusion barrier and has been used extensively. For instance, U.S. Pat. No. 6,958,296 B2 describes a method for forming a titanium silicon nitride (TiSiN) diffusion-barrier layer. The TiSiN layer is deposited in a feature of the semiconductor device prior to Cu deposition, and a Cu layer is deposited over the TiSiN barrier to form the Cu-containing conductive element.

Above Cu-containing conductive interconnect elements, a dielectric barrier liner is typically deposited to achieve passivation towards higher interconnect levels. The dielectric barrier liner also plays an important role in integration schemes. It is for instance used as an etch stop layer on top of dielectric layers adjacent to the conductive interconnect element when controlling via etching to prevent an over-etching of an underlying dielectric level in an interconnect stack of an integrated-circuit device. A material frequently used is for instance SiCN.

A disadvantage of this processing is that the materials used for dielectric liners have a rather high value of the relative dielectric constant $\epsilon_r$, which is also referred to in short as k or as the relative permittivity, especially in the context of integrated-circuit devices for high-frequency application, e.g., radio applications.

Integrated-circuit devices fabricated according to advanced processing technologies have interconnect stacks that use ultra-low-k (ULK) materials such as SiOCH (k=2.5). ULK materials improve the performance of the interconnect stack by reducing capacitance and thus, in combination with low-resistivity Cu interconnects, providing a particularly low RC product (R: resistance, C: capacitance). A low RC product reduces the delay in signal propagation along the conductive elements of the interconnect stack.

However, the use of dielectric barrier liners with higher k-values compared to the ULK material degrades the global performance of the interconnect stack since the k-value of the dielectric barrier liners strongly affect the effective dielectric constant of the interconnect stack.

SUMMARY OF THE INVENTION

According a first aspect of the present invention a method is provided for fabricating a self-aligned diffusion-barrier cap on a Cu-containing conductive element in an integrated-circuit device. The method comprises the steps:

providing a substrate having a Cu-containing conductive element that is embedded laterally into a dielectric layer and that has an exposed surface, the dielectric layer being covered partially or completely by a mask layer;

depositing a metal layer on the exposed surface of conductive element;

inducing diffusion of metal from the metal layer into a top section of the conductive element;

removing the remaining metal layer;

letting diffused metal in the top section of the conductive element and particles of a second constituent react with each other so as to build a compound covering the conductive element.

According to the method of the present invention, the metal of the metal layer and the second constituent are chosen so that the compound forms a diffusion barrier against Cu diffusion.

The method of the present invention provides a processing scheme that allows restricting the use of a diffusion barrier against Cu diffusion to the lateral extension of the Cu-containing conductive element. This reduces the impact of the diffusion-barrier material on the effective k value achieved in combination with the dielectric layer, in which the Cu-containing conductive element is laterally embedded.

Therefore, the method of the present invention allows fabricating integrated-circuit devices with improved signal propagation properties, in particular for high-frequency applications. This is achieved by providing a particularly low capacity of the interconnect stack. This is achieved without increasing the risk of device failure due to Cu diffusion.

As a further advantage of the method of the invention, the proposed processing scheme allows achieving a self-alignment of the diffusion-barrier cap on the Cu-containing conductive element. That is, the correct alignment of the diffusion-barrier cap is achieved solely by exploiting physical or chemical effects that depend on the presence of the Cu-containing material of the conductive element. In particular, the correct alignment of the diffusion-barrier cap does not depend on the presence and correct alignment of a mask. It can thus be ensured that the diffusion-barrier cap material is only provided on the Cu-containing conductive element.

The method of the present invention comprises the step of providing a substrate having a Cu-containing conductive element that is embedded laterally into a dielectric layer. This is not be to be construed as implying the Cu-containing conductive element is arranged immediately adjacent to the dielectric layer. Typically, other functional layers will be present, such as a diffusion-barrier layer that prevents diffusion of Cu in lateral directions to dielectric layers of an underlying interconnect level, or both.

The term "exposed surface" means that no further layers are present on the Cu-containing conductive element at this processing stage, which cover the Cu-containing conductive element. At this processing stage, as stated above, the dielectric layer is covered partially or completely by a mask layer.

This processing stage can be achieved without having to laterally adjust the mask layer so as to provide a proper alignment. For instance, the substrate can be subjected to a chemical mechanical polishing (CMP). The mask layer thus forms a hard mask in such an embodiment. The mask layer can for instance be made with a dense dielectric like $SiO_2$, SiCN, SiN, SiOC, or other known dense dielectrics. A photo resist mask would not be suitable in an embodiment that uses CMP at this stage.

The step of depositing a metal layer on the exposed surface of the conductive element does not exclude depositing the metal layer also on the mask layer. In fact, depositing the metal layer also on the mask layer forms one embodiment of the method of the invention. Even if the metal layer cannot be deposited on the exposed surface of the conductive element in a self-aligned manner, the self-alignment of the formation of the diffusion-barrier cap can be achieved by later processing steps of the method of the invention. The formation of the diffusion-barrier cap relies on a diffusion of metal from the metal layer into a top section of the conductive element. After that, the remaining metal layer is removed. Here, the "remaining" metal layer is the metal layer that is present after the step of inducing diffusion of metal from this metal layer into the top section of the conductive element. It should be noted that the terms "metal layer" and "metal from the metal layer" strictly refer to the layer deposited on the Cu-containing conductive element and its material, respectively, and shall not be understood as referring the Cu-containing conductive element and its material.

The diffusion barrier cap is then formed by letting the metal diffused from the metal layer and particles of a second constituent react with each other in the top section of the conductive element so as to build a compound that covers the conductive element. The term compound includes as different alternative embodiments the case of a chemical compound, which is a material of two or more different, chemically bonded chemical elements with a fixed ratio determining the composition of the compound, and the case of an alloy, which may also take the form of a solution of different constituents.

According to the method of the invention, the metal of the metal layer and the second constituent are chosen such that the compound forms a diffusion barrier against Cu diffusion. At this point, the skilled person can rely on his or her knowledge of compounds, which per se are known in the art as suitable for forming barriers against Cu diffusion. Several examples will be provided in the below description of embodiments.

Thus, the following description is directed to embodiments of the method of the invention. The embodiments can be combined with each other, unless explicitly described as alternatives to each other.

Several metals are suitable for use in the metal layer. Titanium (Ti) has excellent diffusion properties within Cu. As will be discussed in the context of a further embodiment, Ti has the further advantage of partially diffusing within a $SiO_2$ mask layer. Finally, several compounds containing Ti are known to be an excellent barrier against Cu diffusion. Such compounds are for instance TiSi, TiN, or $TiO_2$. Another suitable metal for the metal layer is tantalum (Ta). TaSi and TaN are know compounds with good barrier properties against Cu diffusion. The same holds for Co, where CoSi, CoN, and CoWP and other known components are known as diffusion barriers for Cu. Of course, further components might be discovered in the future, which can be fabricated by the method of the invention and form good diffusion barriers.

As can be deduced from the previous description, the second constituent is in different embodiments chosen from a group of elements containing silicon (Si), nitrogen (N), and oxygen (O).

The compound that forms the diffusion-barrier cap contains in other embodiment two or more of the mentioned metals. To this end, an alloy containing two or more of these metal elements can be deposited as the metal layer during the processing of the present invention.

In further embodiments, more than one second constituent is used for the formation of the compound. For instance, silicon and nitrogen can be used in combination to form a TiSiN diffusion-barrier cap.

The formation of the compound can be achieved by different approaches. In one embodiment, the step of letting the diffused metal in the top section of the conductive element and particles of the second constituent react with each other comprises decomposing a precursor molecule. The precursor molecule contains the second constituent. The decomposition preferably takes place at the surface of the conductive element. For instance, a plasma process can be used to accomplish this. Suitable precursor molecules for the use of Si as the second constituent are for instance silane and trimethyl silane.

In an alternative embodiment, annealing the substrate in a gaseous atmosphere containing or consisting of the second constituent is used to let diffused metal in the top section of the conductive element and particles of the second constituent react with each other. This method is particularly suitable for the use of nitrogen as the second constituent.

It is possible to perform the two alternative methods in sequence, for instance in order to fabricate a TiSiN diffusion-barrier cap. In particular, in one embodiment the process has a first step, during which Si is provided in a plasma, followed by a second step, during which N is provided in a plasma. These steps can be assisted by setting a suitable temperature. In another embodiment $NH_3$ is taken as one of the reactants in the decomposing step for introducing, e. g., Si and N into the layers at the same time.

In one embodiment, the mask layer is removed before the step of letting the diffused metal and the particles of the second constituent react with each other. This further reduces the dielectric permittivity and is particularly suitable in a process, which aims at the formation of air cavities between the Cu-containing conductive elements.

However, it should be noted that the presence of the mask layer can be advantageous, namely for the provision of a self-aligned etch-stop layer between the Cu-containing conductive elements. In particular, to improve this property, the method of the invention comprises in one embodiment a step of depositing the metal layer also on the mask layer, which is preferably performed concurrently with the deposition of the metal layer on the conductive element, i. e., in the same deposition step. The presence of an etch-stop layer helps to prevent undesired etching of the dielectric layer during the formation of an opening in a second dielectric layer on the next interconnect level for the formation of a via. A misaligned via opening that not only extends on the conductive element but also on the dielectric layer in its neighborhood, will not extend into the dielectric layer due to the presence of the etch-stop layer.

The formation of the etch-stop layer is in one embodiment performed with the following steps:

inducing diffusion of metal from the metal layer also into a top section of the mask layer;

removing the remaining metal layer also from the mask layer;

letting diffused metal in the top section of the dielectric layer and particles of the second constituent react with each other so as to build a second compound covering the surface of the conductive element. The covering with the second compound forms the etch-stop layer. This processing can be performed in parallel with the processing of the diffusion-barrier cap barrier and does not induce any additional complexity.

In a further embodiment, air cavities are formed on the basis of this processing by performing the following steps:

depositing a second dielectric layer covering the conductive element and the mask layer, after the step of letting diffused metal in the top section of the conductive element and particles of the second constituent react with each other;

etching a via opening in the second dielectric layer using an etching agent that attacks the second dielectric layer;

wherein the second constituent and the etching agent are chosen so that additionally the second compound forms an etch stop for the etching agent.

A second method aspect of the invention is constituted by a method for fabricating an integrated-circuit device. The method comprises fabricating an interconnect stack with at least two interconnect levels and Cu-containing conductive elements on the interconnect levels. According to this method, fabricating the interconnect stack comprises fabricating a diffusion-barrier cap on the Cu-containing conductive element of a respective interconnect level according to the method of the first aspect of the invention or one of its embodiments. The advantages of this method correspond to those of these method, which have been described hereinabove.

A third aspect of the invention is formed by an integrated-circuit device that comprises a Cu-containing conductive element. The conductive element is embedded laterally into a dielectric layer or air. A diffusion-barrier cap covers the conductive element and is formed of a compound. The compound is formed of a metal provided by diffusion into a top section of the conductive element, and of a second constituent. The metal and the second constituent are chosen so that the compound forms a diffusion barrier against Cu diffusion.

The integrated-circuit device of the present aspect of the invention has improved signal propagation properties, in particular for high-frequency applications. This is achieved by providing a self-aligned barrier cap on the conductive element. This allows avoiding a barrier liner that extends into the dielectric layer. Thus, the capacity of an interconnect stack of the integrated-circuit device is particularly low. This is achieved without increasing the risk of device failure due to Cu diffusion.

The integrated-circuit device of the third aspect of the invention contains diffused metal in a top section of the conductive element, and as such is based on the processing according to the method of the first aspect of the invention. In many cases not all the metal that is diffused into the conductive element reacts with the second constituent, depending on the diffusion depth of the metal and on the processing conditions during diffusion and the reaction step for forming the compound. Therefore, the presence of diffused metal underneath the diffusion barrier cap in the integrated-circuit device is a clear sign of processing according to the method of the first aspect of the invention.

The following description is directed to embodiments of the integrated-circuit device of the invention. The embodiments can be combined with each other, unless explicitly described as alternatives to each other.

In particular, the diffusion-barrier cap can be a self-aligned diffusion barrier cap. The advantages of self-aligned processing have been described in the context of the method of the first aspect of the invention.

In other embodiments of the integrated-circuit device, the metal of the compound forming the diffusion-barrier cap is Titanium, Tantalum, Cobalt or Nickel. The second constituent of the compound is in some embodiments Silicon, Nitrogen, or Oxygen.

Further embodiments of both aspects of the invention the invention are also defined in the dependent claims.

BRIEF DESCRIPTION OF THE DRAWINGS

The invention will now be explained in more detail with reference to the drawings.

DETAILED DESCRIPTION OF EMBODIMENTS

Figure 1:
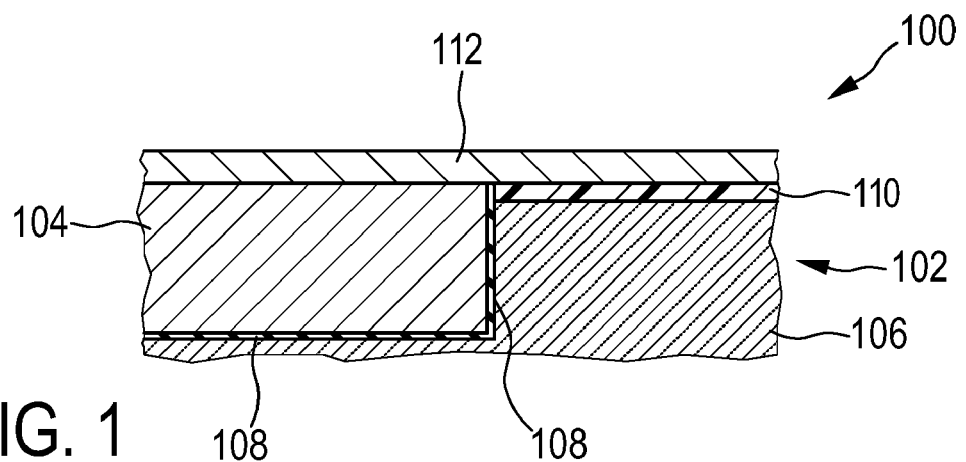
FIGS. 1 to 4 are schematic cross-sectional views of a section of an interconnect stack of an integrated-circuit device during different processing stages of an embodiment of a method for fabricating a diffusion-barrier cap according to the invention.
Figure 2:
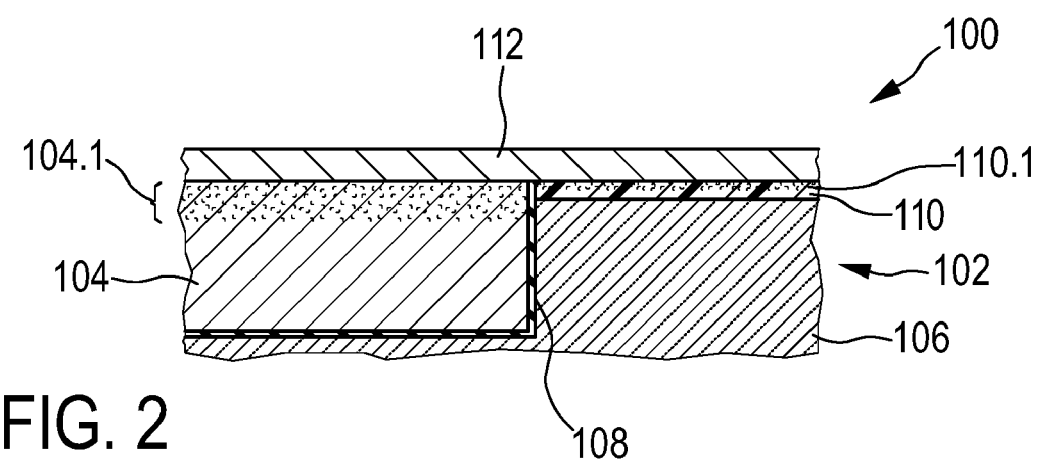

FIGS. 1 to 4 are schematic cross-sectional views of a section of an interconnect stack 102 of an integrated-circuit device 100 during different processing stages of an embodiment of a method for fabricating a diffusion-barrier cap according to the invention.

The interconnect stack 102 shown in FIG. 1 at an intermediate processing stage contains a Cu-containing conductive element 104, which will also referred to as interconnect element 104 in the following. The interconnect element 104 is embedded laterally in a dielectric layer 106. The dielectric layer 106 is made of an ultra-low-k (ULK) material. Numerous suitable ULK-materials are known in the art. For example, SiOCH with k=2.5 can be used for the dielectric layer 106.

A diffusion-barrier layer 108 is provided between the interconnect element 104 and the dielectric layer 106 on the sidewalls and bottom faces. Suitable diffusion-barrier layer materials are well known in the art and include, by way of example, conformally deposited material layers of TaN, Ta, CuSiN, and SiN, or other well known barrier-layer materials. The structure described heretofore can be fabricated by a known damascene or dual-damascene process.

The dielectric layer 106 is in the present embodiment completely covered by a mask layer 110, which is made of $SiO_2$. The mask layer is a thin film and supports the underlying ULK material during patterning, i. e. etching and lithography steps, and during a Cu chemical mechanical polishing step, where it improves the control of the process and prevents an undesired opening on the ULK material. In typical dual-damascene processing, the structure of FIG. 1 has been subjected to a CMP step after copper deposition, before further processing according to the present embodiment continues.

Further referring to the processing stage shown in FIG. 1, a metal layer 112 has been deposited on the structure provided after the CMP step. An example of a suitable metal is titanium (Ti). The following description focuses on this example without implying any restriction on choice of the metal. Other examples of suitable metals have been described previously in this application. The metal layer 112 has been deposited on the complete substrate surface in the present embodiment. In another embodiment, where no deposition of the metal layer on the dielectric layer is desired, the deposition can be laterally restricted to the interconnect element 104 by known techniques.

The integrated-circuit device 100 is then subjected to an annealing step for inducing or enhancing diffusion of titanium from the metal layer 112 into a top section 104.1 of the interconnect element 104. In the present embodiment, diffusion takes also place from the metal layer 112 into a top section 110.1 of the $SiO_2$ mask layer 110. The diffusion of titanium into the interconnect element 104 and into the mask layer 110 takes place simultaneously. Care is taken that the diffusion covers only top sections 104.1 of the interconnect element and 110.1 of the mask layer. This can be controlled by setting a suitable temperature or temperature profile during annealing time span, and by limiting the annealing time span.

Figure 3:
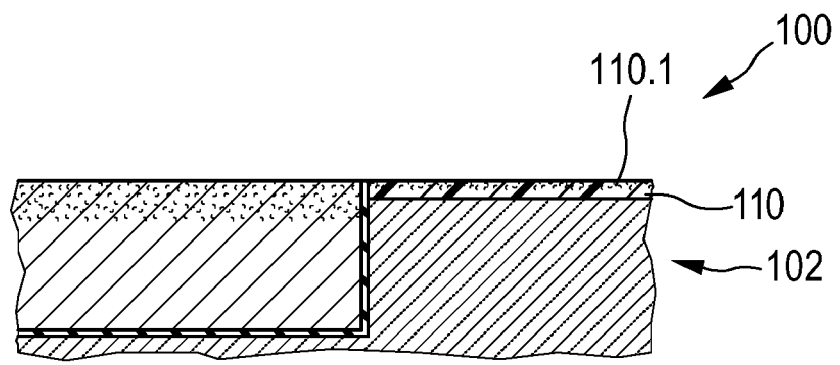
Figure 4:
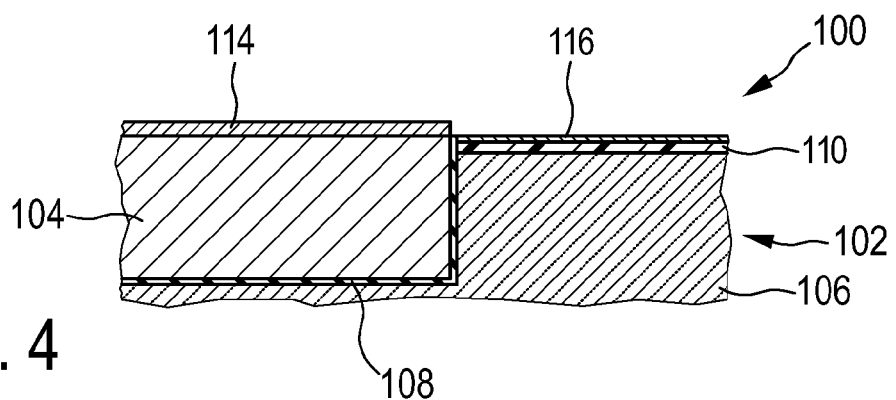

Afterwards, as shown in FIG. 3, the unreacted remaining metal layer 112 is removed from the surface using a suitable wet chemistry. Alternatively, a reactive ion etching treatment can be used for this step.

After that, the diffused Ti in the top section 104.1 of the interconnect element 104 reacts with a second constituent. In the present embodiment, without restriction, silicon Si atoms are incorporated at the surface of the interconnect element 104 for this purpose. This can be achieved for instance by using a plasma process, involving a decomposition of Si-based precursors, such as trimethylsilane, silane or other known suitable precursor molecules. This process induces the formation of a TiSi-rich layer 114 at the surface of the interconnect element 104. This is occurs because the TiSi compound is more stabile than a TiCu compound. The TiSi-rich layer 114 functions as a diffusion-barrier cap, and will also be referred to as such hereinafter.

At the same time, the deposited second constituent, silicon in the present example, can also react with Ti atoms present in the top section 110.1 of the mask layer 110. This way, a dielectric surface layer of the type $Ti_x/Si_y/O$ 116 is formed on top of the mask layer 110. The $Ti_x/Si_y/O$ layer is also referred to as the Ti/Si/O layer and as the etch-stop layer 116 herein. TiSi is known to be an excellent barrier material against Cu diffusion, and the Ti/Si/O layer 116, which is formed on top of the dielectric mask layer 112 forms an excellent hard mask against an etching process that would attack the underlying dielectric layer 106 in the absence of the insulating Ti/Si/O layer 116.

The method described with reference FIGS. 1 to 4 provides a way to fabricate the self-aligned diffusion-barrier cap 114 in the form of the TiSi-rich layer, or in the form of an alternative material layer with similar diffusion-barrier properties. Further interconnect levels can then be fabricated on top of the structure shown in FIG. 4. Therefore, an accurate integration of Cu-containing interconnect elements can be achieved. The described method therefore allows improving the performance of an interconnect stack by providing the self-aligned efficient diffusion-barrier cap 114 on the interconnect element 104. No dielectric liner is needed.

Figure 5:
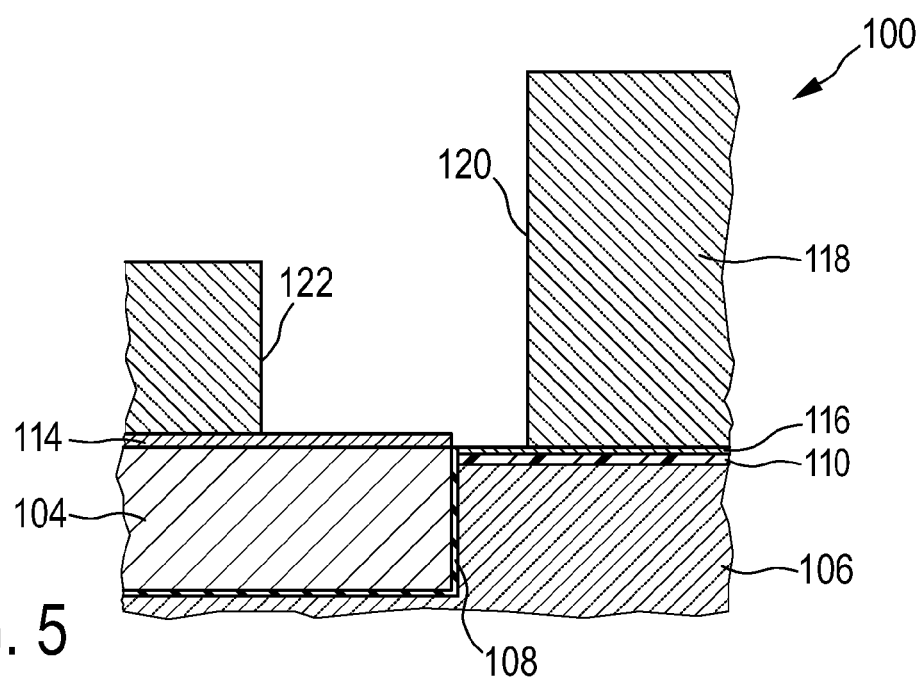
FIG. 5 is a schematic cross-sectional view illustrating the etch-stop function of a second compound built from a mask layer an a deposited metal layer in the embodiment of FIGS. 1 to 4.

FIG. 5 is a schematic cross-sectional view illustrating the etch-stop function of a second compound built from a mask layer on a deposited metal layer in the embodiment of FIGS. 1 to 4.

The processing of FIGS. 1 to 4 has continued to the processing stage, which is shown in FIG. 5, with the deposition of a second dielectric layer 118 and the formation of openings 120 and 122 in the second dielectric layer 118 for a second interconnect element and a via connecting the second interconnect element with the interconnect element 104, respectively. The opening 120 is also referred to as the via opening. Usually, the openings 120 and 122 will be well aligned to the underlying interconnect element 104. FIG. 5 illustrates a rather exceptional case, in which the via opening 120 is slightly misaligned. The via opening 120 extends beyond a right lateral edge of the interconnect element 104 and into a lateral region of the dielectric 106. However, thanks to the presence of the Ti/Si/O or etch-stop layer 116, the formation of the via opening 122 by etching stops on the etch-stop layer 116 due to its excellent etch-stop properties. This way, an over-etch of the via opening 122 into the dielectric layer 106 is avoided. Such an over-etch could potentially damage the structure and lead to device failure.

Figure 6:
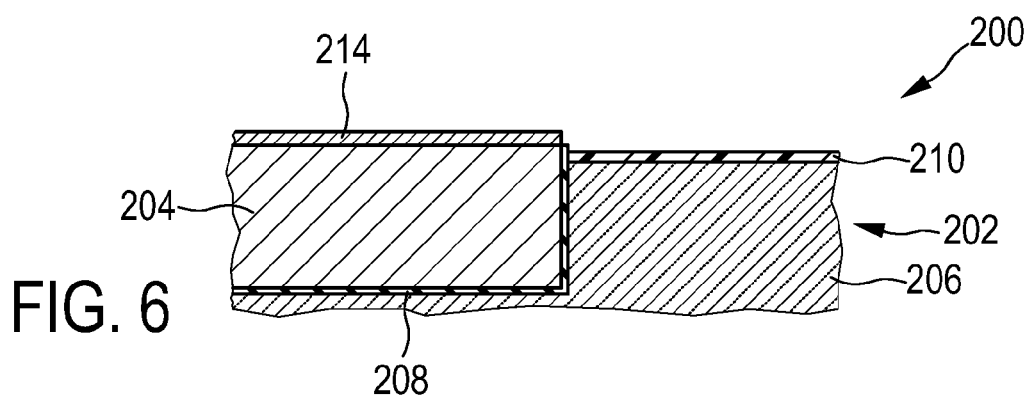
FIG. 6 is an intermediate step of an alternative embodiment of a method for fabricating a diffusion-barrier cap according to the invention.

FIG. 6 is a schematic cross-sectional view of a section of an interconnect stack 202 of an integrated-circuit device 200 at an intermediate step of an alternative embodiment of a method for fabricating a diffusion-barrier cap according to the invention.

The processing step shown in FIG. 6 is based on that described with reference to FIGS. 1 to 4 with an exception that will be described further below. Unless stated otherwise explicitly, like structural elements in the two embodiments are denoted by reference numerals according to a rule, in which reference numerals of the present embodiment differ from those of the previous embodiment only in the first digit, in which "1" is replaced by "2".

At the processing stage shown in FIG. 6 no second mask layer or Ti/Si/O or etch-stop layer (116 in FIG. 4) is present, so that the mask layer 210 is exposed at the substrate surface. The formation of the Ti/Si/O layer can be avoided by using a wet chemistry after the capping of the Cu interconnect element 204 with Ti and before the formation of the diffusion-barrier cap 214.

Figure 7:
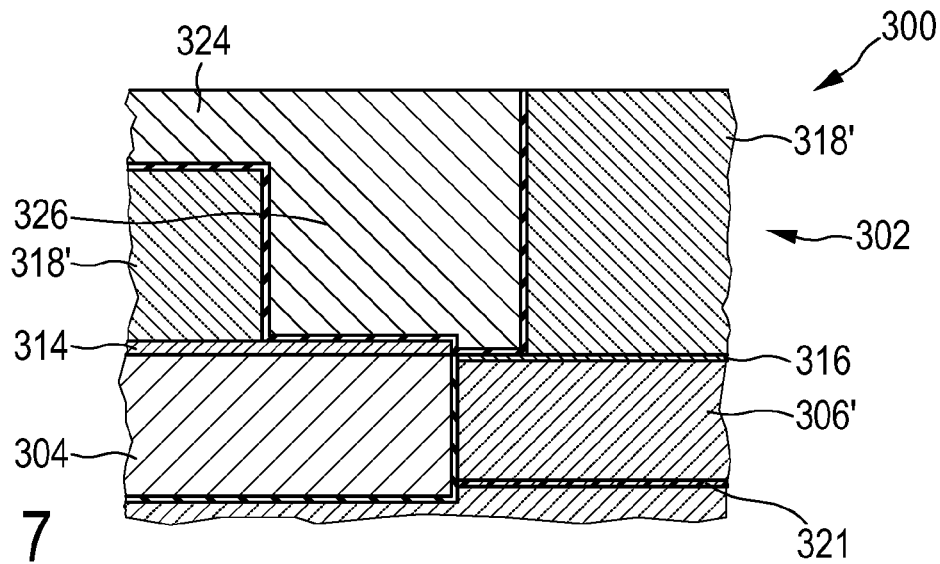
FIGS. 7 to 9 show cross-sectional views of a section of an interconnect stack of an integrated-circuit device according to a third embodiment of the method of the invention.
Figure 8:
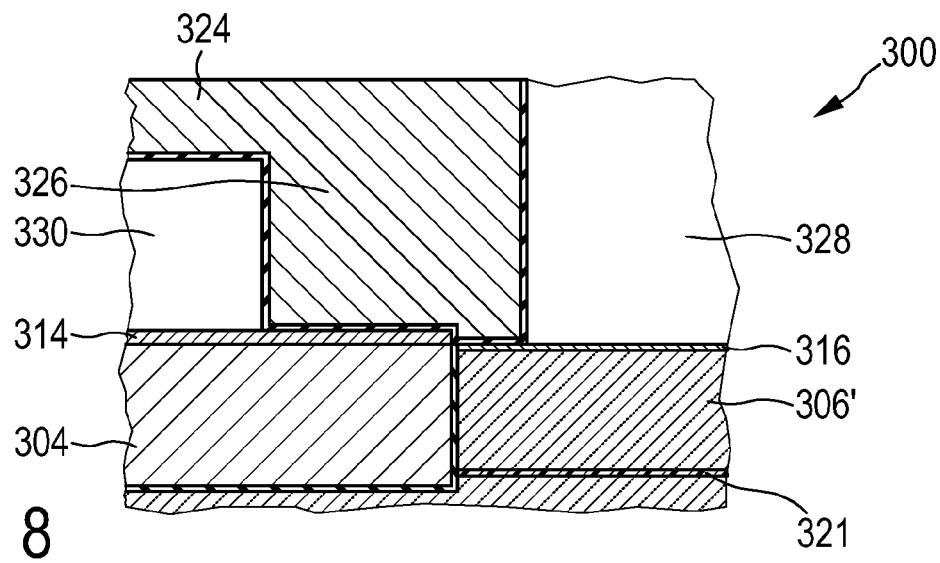
Figure 9:
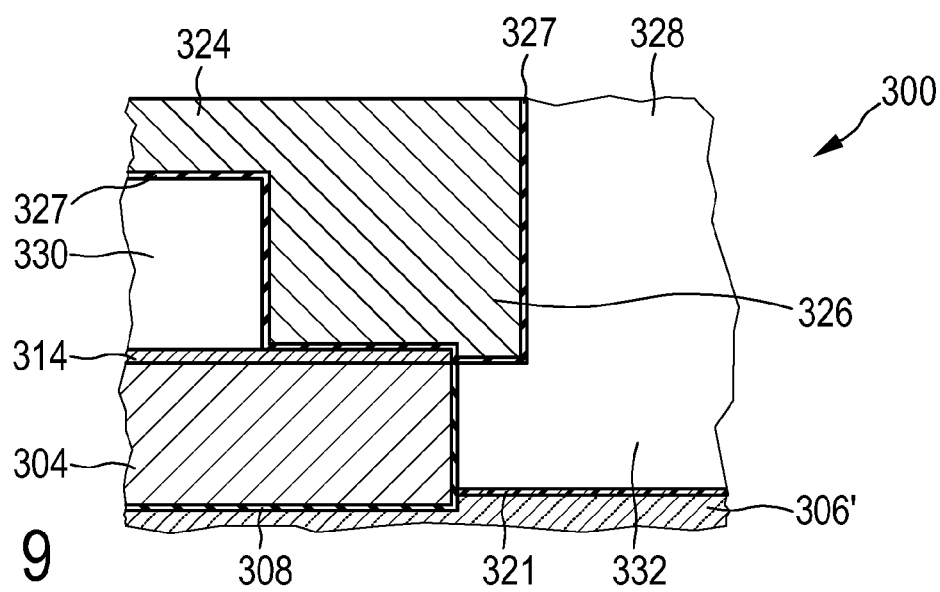

FIGS. 7 to 9 show cross-sectional views of a section of an interconnect stack 302 of an integrated-circuit device 300 according to a third embodiment of the method of the invention. Again, like structural elements in comparison with the previous embodiments are shown with reference numerals which deviate from those of the previous embodiments only in the first digit, which is "3" in the present embodiment.

The embodiment comprises the formation of air cavities for improving the dielectric properties of the interconnect stack. Unlike in the previous embodiments, the dielectric layer 306' and the second dielectric layer 318' are deposited temporarily only, and for this reason are made of $SiO_2$. An additional wet-etch stop layer 321 is provided at the level of the bottom of the interconnect element 304 and embedded in dielectric material of the dielectric layer 306'.

After completion of the processing of the interconnect element 304 and a second interconnect element 324, which are connected by a via 326, the dielectric layer 318' is removed down the etch-stop layer 316. This way, air cavities 328 and 330 are formed on the level of the second interconnect element 324 and the via 326. Subsequently, the Ti/Si/O or etch-stop layer 316 is removed, and formation of air cavities continues with the removal of the dielectric layer 306' by a wet etch, which stops on the wet-etch stop layer 321. This completes the formation of air cavities on this level by adding an air cavity 332.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method for fabricating a diffusion-barrier cap on a Cu-containing conductive element in an integrated-circuit device, comprising the steps:
    providing a substrate having a Cu-containing conductive element that is embedded laterally into a dielectric layer and that has an exposed surface, the dielectric layer being covered partially or completely by a mask layer;
    depositing a metal layer on the exposed surface of conductive element;
    inducing diffusion of metal from the metal layer into a top section of the conductive element;
    removing the remaining metal layer;
    letting diffused metal in the top section of the conductive element and particles of a second constituent react with each other so as to build a compound covering the conductive element,
    wherein the metal of the metal layer and the second constituent are chosen so that the compound forms a diffusion barrier against Cu diffusion;
    and further comprising:
    depositing the metal layer also on the mask layer, concurrently with the deposition of the metal layer on the conductive element;
    inducing diffusion of metal from the metal layer also into a top section of the mask layer;
    removing the remaining metal layer also from the mask layer; and
    letting diffused metal and particles of the second constituent also react with each other also in the top section of the mask layer so as to build a second compound covering the surface of the mask layer.

2. The method of claim 1, wherein the metal layer is made of titanium, tantalum, cobalt or nickel, or made of an alloy containing two or more of these elements.

3. The method of claim 1, wherein the second constituent of the compound is chosen from a group of elements containing silicon, nitrogen, and oxygen.

4. The method of claim 1, wherein the step of letting diffused metal in the top section of the conductive element and particles of the second constituent react with each other comprises decomposing a precursor molecule, which contains the second constituent, at the surface of the conductive element by a reactive ion etching process.

5. The method of claim 1, wherein the step of letting diffused metal in the top section of the conductive element and particles of the second constituent react with each other comprises annealing the substrate in a gaseous atmosphere containing or consisting of the second constituent.

6. The method of claim 1, comprising a step of removing the mask layer before the step of letting the diffused metal and the particles of the second constituent react with each other.

7. The method of claim 1, further comprising the steps:
    depositing a second dielectric layer covering the conductive element and the mask layer, after the step of letting diffused metal in the top section of the conductive element and particles of the second constituent react with each other;
    etching a via opening in the second dielectric layer using an etching agent that attacks the second dielectric layer;
    wherein the second constituent and the etching agent are chosen so that additionally the second compound forms an etch-stop layer for the etching agent.

8. A method for fabricating an integrated-circuit device, comprising:
    fabricating an interconnect stack with at least two interconnect levels and Cu-containing conductive elements on the interconnect levels,
    wherein fabricating the interconnect stack comprises fabricating a diffusion-barrier cap on a the Cu-containing conductive element of a respective interconnect level according to the method of claim 1.

9. An integrated-circuit device, comprising:
    a Cu-containing conductive element that is embedded laterally into a dielectric layer;
    a diffusion-barrier cap covering the conductive element and being forming by a compound, wherein the compound is formed of a metal provided by diffusion into a top section of the conductive element, and of a second constituent, wherein the metal and the second constituent are chosen so that the compound forms a diffusion barrier against Cu diffusion; and
    a mask layer covering at least part of the dielectric layer, the mask layer being formed by a compound, wherein the compound is formed of a metal provided by diffusion into a top section of the mask layer and of a second constituent so as to form a second compound covering at least a portion of the mask layer.

10. The integrated-circuit device of claim 9, wherein the metal of the compound forming the diffusion-barrier cap is titanium, tantalum, cobalt or nickel.

11. The integrated-circuit device of claim 9, wherein the second constituent of the compound is chosen from a group of elements containing silicon, nitrogen, and oxygen.

* * * * *